United States Patent [19]

Ichihara

[11] Patent Number: 5,170,130

[45] Date of Patent: Dec. 8, 1992

[54] PHASE LOCK LOOP CIRCUIT WITH A SUBSIDIARY LOOP FILTER

[75] Inventor: Masaki Ichihara, Tokyo, Japan

[73] Assignee: NEC Corporation, Japan

[21] Appl. No.: 762,903

[22] Filed: Sep. 19, 1991

[30] Foreign Application Priority Data

Sep. 19, 1990 [JP] Japan .................. 2-249102

[51] Int. Cl.⁵ .................. H03K 5/13; H03K 5/22
[52] U.S. Cl. .................. 328/155; 307/262; 331/17
[58] Field of Search ............... 328/155, 133; 307/520, 307/521, 262; 331/1 A, 17, 25

[56] References Cited

U.S. PATENT DOCUMENTS

| | | | |
|---|---|---|---|
| 4,007,429 | 2/1977 | Cadalora et al. | 331/17 |
| 4,559,505 | 12/1985 | Suaréz et al. | 331/17 |
| 4,745,371 | 5/1988 | Haine | 331/17 |
| 4,752,749 | 6/1988 | Moger | 331/17 |
| 4,849,663 | 7/1989 | Kunze et al. | 307/521 |
| 4,937,536 | 6/1990 | Reinhardt et al. | 331/17 |

Primary Examiner—Timothy P. Callahan
Attorney, Agent, or Firm—Ostrolenk, Faber, Gerb & Soffen

[57] ABSTRACT

A phase lock loop circuit comprising a charge pump circuit (13), a loop filter (14), and a voltage controlled oscillator (15), a subsidiary loop filter (20) connected to the charge pump circuit and the loop filter in a phase lock operation through first and second switching circuits (21) and (22). The loop filter comprises a filter capacitor (C1) and delivers a filtered signal to the voltage controlled oscillator. In the phase lock operation, the subsidiary loop filter reduces a charge duration and a discharge duration of the filter capacitor. As a result, a voltage of the filtered signal varies rapidly and the phase lock operation is carried out in high speed.

3 Claims, 4 Drawing Sheets

PHASE LOCK LOOP CIRCUIT WITH A SUBSIDIARY LOOP FILTER

BACKGROUND OF THE INVENTION

This invention relates to a phase lock loop circuit for carrying out phase lock operation in high speed. Such a phase lock loop circuit is particularly useful for use in channel designation for a digital radio communication device.

Recently, it is has become necessary to provide a digital mobile radio telephone set which utilizes a time divisional multiple access system. In such a digital mobile radio telephone set, it is necessary to change one talk channel to another talk channel in high speed. In this event, the digital mobile radio telephone set requires a phase lock loop circuit which can carry out a phase lock operation in high speed.

As well known in the art, the phase lock loop circuit comprises a reference signal generator, a voltage controlled oscillator, a frequency divider, and a phase comparator. The reference signal generator generates a reference signal having a reference frequency and a reference phase. The voltage controlled oscillator is supplied with an oscillator input signal and produces a phase controlled signal having an output frequency in response to the oscillator input signal. The frequency divider has a predetermined frequency division ratio N where N represents a positive integer. The phase controlled signal is divided into a frequency divided signal by the frequency divider. The frequency divided signal has a signal phase and a divided frequency which depends upon the predetermined frequency division ratio N. The phase comparator is supplied with the reference signal and the frequency divided signal and compares the signal phase with the reference phase to produce a comparison result signal representative of a phase error between the reference phase and the signal phase.

The phase lock loop circuit further comprises a filter control circuit and a loop filter connected to the filter control circuit. As will later be described in more detail, the filter control circuit is connected to the phase comparator and serves for supplying a filter control signal to the loop filter in response to the comparison result signal. The loop filter comprises a filter capacitor which is selectively charged and discharged in response to the filter control signal. The loop filter thereby filters the filter control signal into a filtered signal to supply the voltage controlled oscillator with the filtered signal as the oscillator input signal. Thus, a phase control loop is established so that the phase controlled signal has an output frequency N times as large as the reference frequency.

In such a phase lock loop circuit, it is proposed to increase a cut-off frequency of the loop filter in order to carry out the phase lock operation at high speeds. The phase control loop has, however, a degraded stability in a stationary state when the cut-off frequency is increased.

In order to avoid the above-described disadvantage, it is proposed that the phase lock loop circuit comprise a frequency control circuit for varying the cut-off frequency of the loop filter. As will later be described in more detail, the frequency control circuit controls the loop filter so that the loop filter has a high cut-off frequency in the phase lock operation and that the loop filter has a low cut-off frequency in the stationary state. In this event, the cut-off frequency varies discontinuously between the high cut-off frequency and the low cut-off frequency. This means that a voltage of the filtered signal varies discontinuously. As a result, the output frequency of the phase controlled signal changes to an unexpected value.

SUMMARY OF THE INVENTION

It is therefore an object of this invention to provide a phase lock loop circuit which is capable of producing a phase controlled signal without discontinuity of an output frequency.

Other objects of this invention will become clear as the description proceeds.

In describing the gist of this invention, it is possible to understand that a phase lock loop circuit serves for carrying out a phase lock operation in response to a reference signal and a switch control signal which indicates a beginning and an end of said phase lock operation.

According to this invention, the phase lock loop circuit comprises: (A) a signal generator for generating the reference signal having a reference phase; (B) a voltage controlled oscillator supplied with an oscillator input signal for generating a phase controlled signal in response to the oscillator input signal; (C) a frequency divider connected to the voltage controlled oscillator for producing a frequency divided signal having a signal phase; (D) a phase comparator connected to the signal generator and the frequency divider for comparing the signal phase with the reference phase to produce a comparison result signal representative of a phase error between the reference phase and the signal phase; (E) a first loop filter responsive to a filter input signal and connected to the voltage controlled oscillator for filtering the filter input signal into a first filtered signal to supply the voltage controlled oscillator with the first filtered signal, the first loop filter comprising a filter capacitor which is selectively charged and discharged in response to the filter input signal; (F) a filter control circuit between the phase comparator and the first loop filter for supplying a filter control signal as the filter input signal to the first loop filter in response to the comparison result signal; (G) a first switching circuit connected to the filter control circuit for producing the filter control signal when the first switching circuit is supplied with the switch control signal, the switch control signal being supplied on beginning of the phase lock operation and being stopped on end of the phase lock operation; (H) a second loop filter connected to the first switching circuit for filtering the filter control signal into a second filtered signal; (I) and a second switching circuit connected between the second loop filter and the first loop filter for supplying the second filtered signal to the filter capacitor when the second switching circuit is supplied with the switch control signal.

DESCRIPTION OF THE PREFERRED EMBODIMENT

Figure 1:
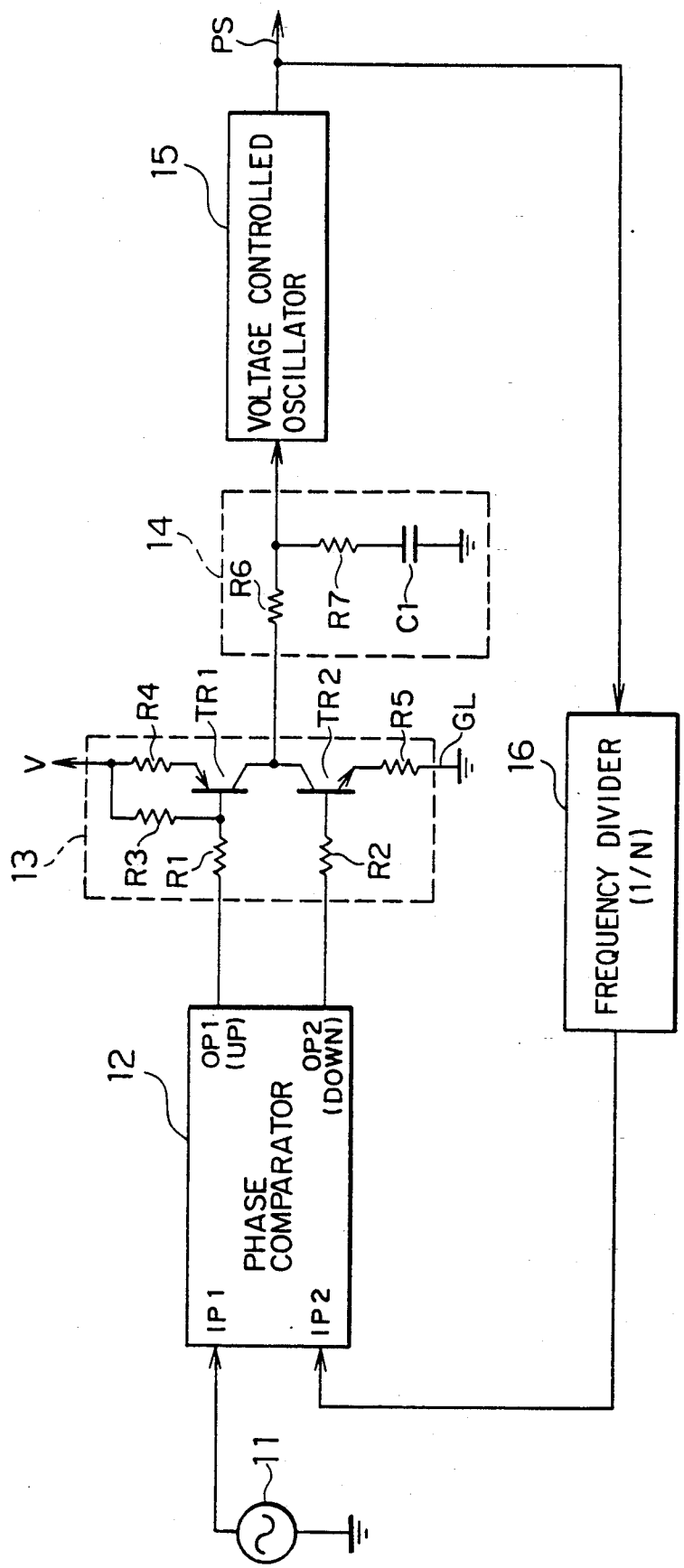
FIG. 1 is a block diagram of a conventional phase lock loop circuit.

Referring to FIG. 1, a conventional phase lock loop circuit will be described at first in order to facilitate understanding of the present invention. The phase lock loop circuit carries out a phase lock operation to produce a phase controlled signal PS having an output frequency and a controlled phase.

The phase lock loop circuit comprises a reference signal generator 11, a phase comparator 12, a charge pump circuit 13, a loop filter 14 comprising a filter capacitor C1, a voltage controlled oscillator 15, and a frequency divider 16. The reference signal generator 11 generates a reference signal having a reference frequency and a reference phase and supplies the reference signal to a first input terminal IP1 of the phase comparator 12.

The phase controlled signal PS delivered from the voltage controlled oscillator 15 is supplied to the frequency divider 16. The frequency divider 16 has a predetermined frequency division ratio N where N represents a positive integer. The phase controlled signal PS is divided into a frequency divided signal by the frequency divider 16. The frequency divided signal has a signal phase and a divided frequency which depends upon the predetermined frequency division ratio N. The frequency divided signal is supplied to a second input terminal IP2 of the phase comparator 12.

Supplied with the reference signal and the frequency divided signal, the phase comparator 12 compares the signal phase with the reference phase and produces first and second comparison result signals which represent phase errors between the reference phase and the signal phase. The phase comparator 12 has first and second output terminals OP1 and OP2. When the phase error has a negative value, the phase comparator 12 produces the first comparison result signal having a logic zero level from the first output terminal OP1. When the phase error has a positive value, the phase comparator 12 produces the second comparison result signal having a logic one level from the second output terminal OP2. The first and the second comparison result signals may collectively be called a comparison result signal.

The charge pump circuit 13 comprises a first transistor TR1 supplied with a predetermined positive voltage V and a second transistor TR2 grounded through a ground line GL. When the phase comparator 12 supplies the first comparison result signal having the logic zero level from the first output terminal OP1 to the first transistor TR1, the first transistor TR1 is put into an on state. Otherwise, the first transistor TR1 is put into an off state. When the first transistor TR1 is put into the on state, the predetermined positive voltage V is supplied, as a filter control signal, to the loop filter 14 through the first transistor TR1. In the loop filter 14, the filter capacitor C1 accumulates electric charges as accumulated electric charges in response to the filter control signal.

When the phase comparator 12 supplies the second comparison result signal having the logic one level from the second output terminal OP2 to the second transistor TR2, the second transistor TR2 is put into an on state. Otherwise, the second transistor TR2 is put into an off state. When the second transistor TR2 is put into the on state, the filter capacitor C1 discharges the accumulated electric charges through the second transistor TR2.

As a result of the above-described charge and discharge operations, the filter control signal is filtered by the loop filter 14 into a filtered signal. The charge pump circuit 13 may be called a filter control circuit. The filtered signal is supplied to the voltage controlled oscillator 15 as an oscillator input signal. When the filter capacitor C1 charges, the voltage controlled oscillator 15 operates so as to increase the controlled frequency. When the filter capacitor C1 is being discharged, the voltage controlled oscillator 15 operates so as to decrease the controlled frequency. Thus, a phase control loop is established so that the phase controlled signal has the output frequency equal to N times as large as the reference frequency.

In such a phase lock loop circuit, it is proposed to increase the cut-off frequency of the loop filter 14 in order to carry out phase lock operation in high speed. The phase control loop has, however, a degraded stability in a stationary state when the cut-off frequency is increased. In order to resolve the above-described problem, it is proposed that the phase lock loop circuit comprise a frequency control circuit for varying the cut-off frequency of the loop filter 14.

Figure 2:
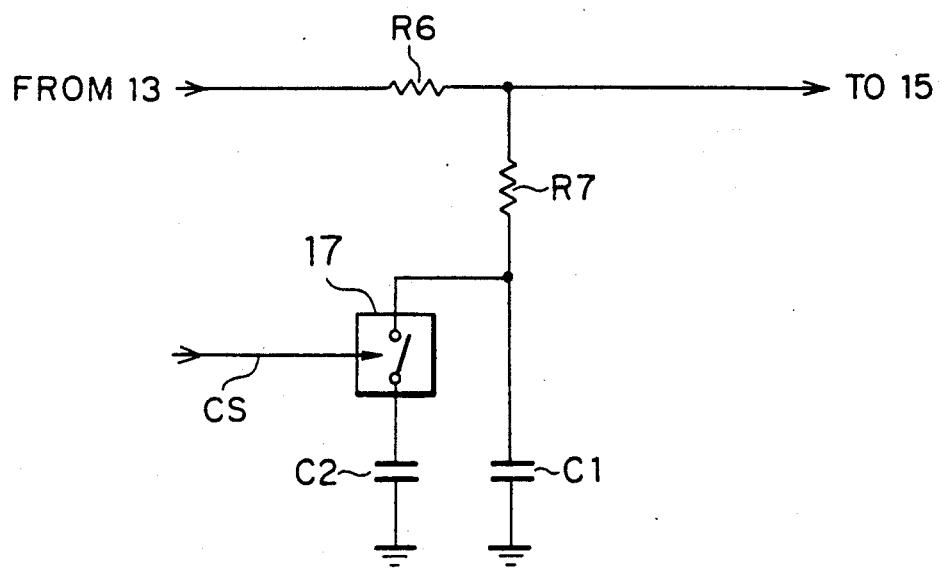
FIG. 2 is a circuit arrangement of a conventional loop filter which is applied to the phase lock loop circuit illustrated in FIG. 1.

Referring to FIG. 2, a subsidiary capacitor C2 is connected in parallel to the filter capacitor C1 through an analog switch 17. The analog switch 17 is put into an on state when the analog switch 17 is supplied with a switch control signal CS in the manner known in the art. The switch control signal CS indicates a beginning and an end of the phase lock operation. In the example being illustrated, the analog switch 17 is put into an off state in the phase lock operation. In this event, the cut-off frequency is increased because the loop filter 14 has a reduced capacity. In the stationary state, the analog switch 17 is supplied with the switch control signal CS and is put into the on state. In this event, the cut-off frequency is decreased because the loop filter 14 has an increased capacity. As obvious from the above-mentioned description, the subsidiary capacitor C2 and the analog switch 17 are regarded as the frequency control circuit. However, the cut-off frequency varies discontinuously when the analog switch 17 is put into the on state or the off state. This means that a voltage of the filtered signal varies discontinuously. As a result, the output frequency of the phase controlled signal PS changes to an unexpected value.

Figure 3:
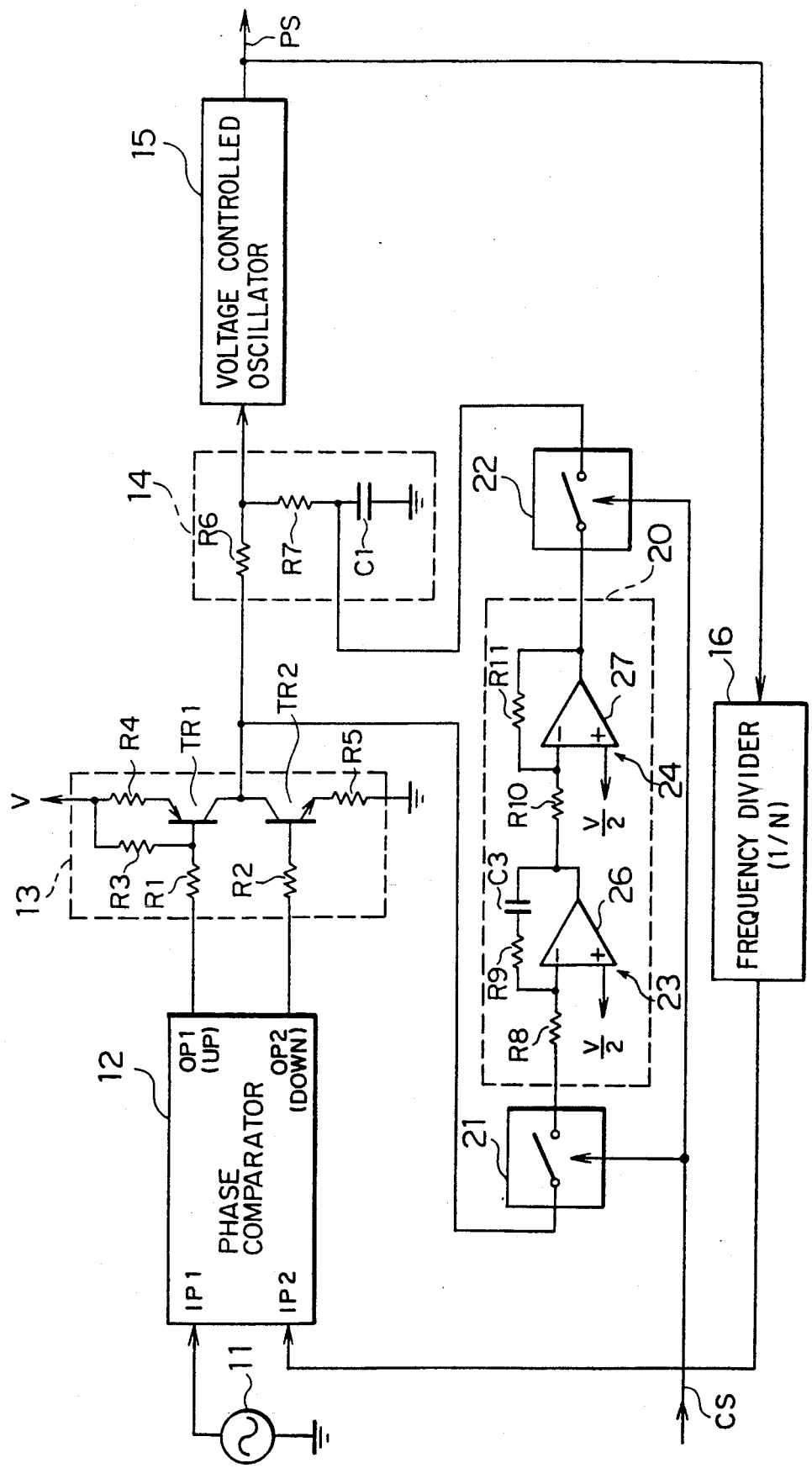
FIG. 3 is a block diagram of a phase lock loop circuit according to a first embodiment of this invention.

Referring to FIG. 3, the description will proceed to a phase lock loop circuit according to a first embodiment of this invention. The phase lock loop circuit is particularly useful in a digital radio communication device such as a digital mobile radio telephone set. The phase lock loop circuit comprises similar parts designated by like reference numerals and additionally a subsidiary loop filter 20, a first switching circuit 21 connected between the charge pump circuit 13 and the subsidiary loop filter 20, and a second switching circuit 22 connected between the subsidiary loop filter 20 and the loop filter 14.

As will shortly be described, the subsidiary loop filter 20 serves for reducing the charge duration and the discharge duration of the filter capacitor C1 in the loop filter 14 in order to carry out the phase lock operation in high speed. The subsidiary loop filter 20 comprises an active filter circuit 23 comprising a first operational amplifier 26. The subsidiary loop filter 20 further comprises an inverting amplifier circuit 24 comprising a second operational amplifier 27.

The first and the second switching circuits 21 and 22 are supplied with the switch control signal CS in the phase lock operation. Each of the first and the second switching circuits 21 and 22 is put into an on state on supply of the switch control signal CS. For example, the switch control signal CS is generated by a phase lock detection circuit (not shown) as well known in the art.

In the phase lock operation, the first and the second switching circuits 21 and 22 are put into the on state because the first and the second switching circuits 21 and 22 are supplied with the switch control signal CS. It will be assumed that the phase comparator 12 produces the first comparison result signal having the logic zero level as a result of comparison between the reference phase and the signal phase. In this event, the predetermined positive voltage V is supplied, as the filter control signal, to the loop filter 14 and the subsidiary loop filter 20 through the first transistor TR1. The active filter circuit 23 filters the filter control signal into an active filtered signal.

It is to be noted here that the active filtered signal has a positive or a negative polarity in inverse polarity relative to the filter control signal. One of the positive and the negative polarities of the active filtered signal should be inverted. For this purpose, the active filtered signal is supplied to the inverting amplifier circuit 24. The inverting amplifier circuit 24 inverts the active filtered signal and produces an inverted signal having an inverted polarity relative to the active filtered signal. The inverted signal is supplied to the filter capacitor C1 through the second switching circuit 22. As a result, the filter capacitor C1 accumulates rapidly the electric charges in response to the inverted signal and the filter control signal supplied from the charge pump circuit 13 through resistors R6 and R7. This means that the charge duration of the filter capacitor C1 is reduced. As a result of the charging operation, the loop filter 14 supplies the filtered signal to the voltage controlled oscillator 15 as an oscillator input signal. It is to be noted here that a voltage of the filtered signal increases rapidly because the charge duration is reduced. This means that the phase lock operation is carried out in high speed.

When the phase lock operation completes, namely, in the stationary state, supply of the switch control signal CS is stopped. Each of the first and the second switching circuits 21 and 22 is therefore put into the off state. In this state, the filter capacitor C1 carries out a charge and discharge operation in accordance with the filter control signal only. As a result, the voltage controlled oscillator 15 is controlled stably by the loop filter 14. In other words, the voltage controlled oscillator 15 produces the phase controlled signal without discontinuity of the output frequency.

The above-mentioned operation applies to the case that the phase comparator 12 produces the second comparison result signal having the logic one level. In the phase lock operation, the filter capacitor C1 discharges rapidly the accumulated electric charges through the resistors R6 and R7 and the subsidiary loop filter 20 through the second switching circuit 22. Therefore, the voltage of the filtered signal decreases rapidly. The phase lock operation is carried out in high speed.

In the phase lock loop circuit described above, the phase controlled signal has no unexpected value because the voltage of the filtered signal varies continuously.

The loop filter 14 may be called a first loop filter while the subsidiary loop filter 20 may be called a second loop filter. Under the circumstances, the filtered signal may be called a first filtered signal while the inverted signal may be called a second filtered signal.

Figure 4:
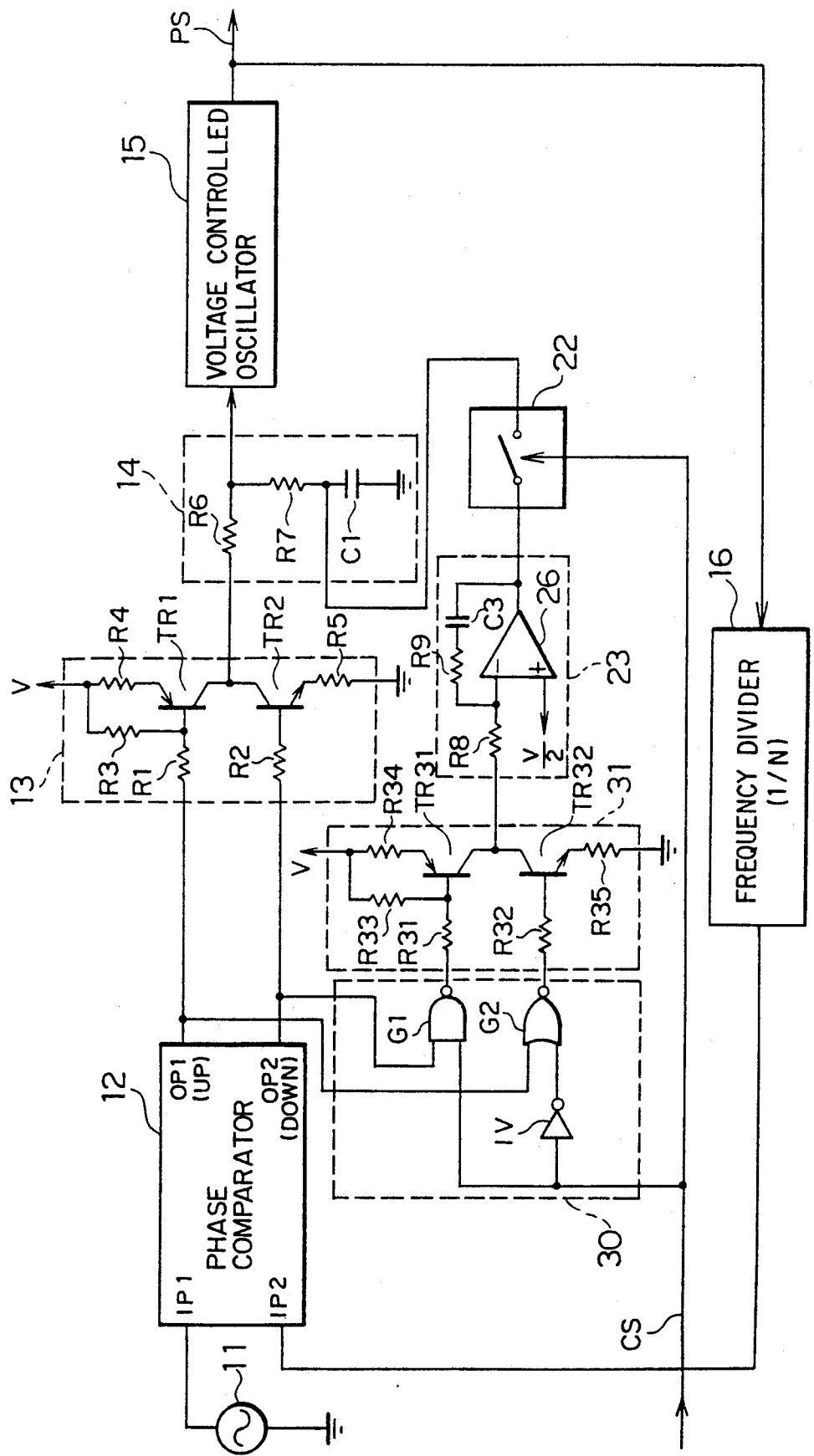
FIG. 4 is a block diagram of a phase lock loop circuit according to a second embodiment of this invention.

Referring to FIG. 4, the description will be made as regards a phase lock loop circuit according to a second embodiment of this invention. The phase lock loop circuit comprises similar parts designated by like reference numerals and additionally a logical processing circuit 30 and a subsidiary charge pump circuit 31. The logical processing circuit 30 is connected to the phase comparator 12 and is supplied with the switch control signal CS. The subsidiary charge pump circuit 31 is similar to the charge pump circuit 13 in structure and is connected between the logical processing circuit 30 and the active filter circuit 23.

The logical processing circuit 30 comprises an inverter IV supplied with the switch control signal CS, a NAND gate G1 supplied with the second comparison result signal and the switch control signal CS, and a NOR gate G2 connected to the inverter IV and supplied with the first comparison result signal. Supplied with the switch control signal CS and the second comparison result signal having the logic one level, the NAND gate G1 delivers a NAND gate output signal having a logic zero level to a first subsidiary transistor TR31 in the subsidiary charge pump circuit 31. In this event, the first subsidiary transistor TR31 is put into an on state. When the switch control signal CS is stopped, the NAND gate G1 produces the NAND gate output signal having a logic one level regardless of the second comparison result signal.

The inverter IV inverts the switch control signal CS and produces an inverted switch control signal having a logic zero level. Supplied with the inverted switch control signal and the first comparison result signal having the logic zero level, the NOR gate G2 delivers a NOR gate output signal having a logic one level to a second subsidiary transistor TR32 in the subsidiary charge pump circuit 31. In this event, the second subsidiary transistor TR32 is put into an on state. When the switch control signal CS is stopped, the NOR gate G2 produces the NOR gate output signal having a logic zero level regardless of the first comparison result signal. As obvious from the above description, each of the first and the second subsidiary transistors TR31 and TR32 is put into the off state when the switch control signal CS is stopped. Under the circumstances, the logical processing circuit 30 can be regarded as the first switching circuit 21 illustrated in FIG. 3. The NAND gate and the NOR gate output signals may collectively be called a logical processed signal.

As will later be described, the subsidiary charge pump circuit 31 carries out complementary operation relative to the charge pump circuit 13 and produces a subsidiary filter control signal. The filter control signal delivered from the charge pump circuit 13 may be called a first filter control signal. The subsidiary filter control signal may be called a second filter control signal. The subsidiary filter control signal is filtered by the active filter circuit 23 into an active filtered signal. The active filtered signal has the same polarity as the filter control signal has. This is because the subsidiary charge pump circuit 31 carries out the complementary operation relative to the charge pump circuit 13. For this reason, it is unnecessary to use the inverting amplifier circuit 24 (FIG. 3).

In the phase lock operation, the second subsidiary transistor TR32 is put into the on state when the phase comparator 12 delivers the first comparison result signal having the logic zero level from the first output terminal OP1 and when the switch control signal CS is supplied to the inverter IV. Simultaneously, the second switching circuit 22 is put into the one state because the second switching circuit 22 is supplied with the switch control signal CS. In this event, the active filter circuit 23 supplies the active filtered signal to the filter capacitor C1 through the second switching circuit 22. As a result, the filter capacitor C1 accumulates rapidly the electric charges in accordance with the active filtered signal and the filter control signal delivered from the charge pump circuit 13. This means that the charge duration of the filter capacitor C1 is reduced. In other words, a voltage of the filtered signal increases rapidly. For the reason, the phase lock operation is carried out in high speed.

In the phase lock operation, if the phase comparator 12 delivers the second comparison result signal having the logic one level from the second output terminal OP2 and if the switch control signal CS is supplied to the NAND gate G1, the first subsidiary transistor TR1 is put into the on state. In this event, the filter capacitor C1 discharges rapidly the accumulated electric charges through the active filter circuit 23 and the second transistor TR2 in the charge pump circuit 13. The voltage of the filtered signal decreases rapidly. Thus, the phase lock operation is carried out in high speed.

When the phase lock operation completes, supply of the switch control signal CS is stopped. As a result, the first and the second subsidiary transistors TR31 and TR32 and the second switching circuit 22 are put into the off state. In this state, the filter capacitor C1 carries out the charge and discharge operation in accordance with the filter control signal only. The voltage controlled oscillator 15 is controlled stably by the loop filter 14. The loop filter 14 may be called a first loop filter. The active filter circuit 23 may be called a second loop filter. The filtered signal delivered from the loop filter 14 may be called a first filtered signal. The active filtered signal delivered from the active filter circuit 23 may be called a second filtered signal.

While this invention has been described in conjunction with several embodiments thereof, it will readily be possible for those skilled in the art to put this invention into practice in various other manners.

What is claimed is:

1. A phase lock loop circuit for use in carrying out a phase lock operation in response to a reference signal and a switch control signal which indicates a beginning and an end of said phase lock operation, said circuit comprising:

a signal generator for generating said reference signal, said reference signal having a reference phase;
   a voltage controlled oscillator supplied with an oscillator input signal for generating a phase controlled signal in response to said oscillator input signal;
   a frequency divider connected to said voltage controlled oscillator for producing a frequency divided signal having a signal phase;
   a phase comparator connected to said signal generator and said frequency divider for comparing said signal phase with said reference phase to produce a comparison result signal representative of a phase error between said reference phase and said signal phase;
   a first loop filter responsive to a filter input signal and connected to said voltage controlled oscillator for filtering said filter input signal into said oscillator input signal, said first loop filter comprising a filter capacitor which is selectively charged and discharged in response to said filter input signal;
   a filter control circuit between said phase comparator and said first loop filter for supplying a filter control signal as said filter input signal to said first loop filter in response to said comparison result signal;
   a first switching circuit connected to said filter control circuit for outputting said filter control signal when said first switching circuit is supplied with said switch control signal, said switch control signal being activated at said beginning of said phase lock operation and being deactivated at said end of said phase lock operation;
   a second loop filter connected to said first switching circuit for filtering said filter control signal into a second filtered signal; and
   a second switching circuit connected between said second loop filter and said first loop filter for supplying said second filtered signal to said filter capacitor when said second switching circuit is activated with said switch control signal.

2. A phase lock loop circuit as claimed in claim 1, wherein said second loop filter comprises:

an active filter circuit connected to said first switching circuit for filtering said filter control signal into an active filtered signal; and
   an inverting amplifier circuit connected to said active filter circuit for inverting said active filtered signal to produce an inverted signal as said second filtered signal.

3. A phase lock loop circuit for use in carrying out a phase lock operation in response to a reference signal and a switch control signal which indicates a beginning and an end of said phase lock operation, said circuit comprising:

a signal generator for generating said reference signal, said reference signal having a reference phase;
   a voltage controlled oscillator supplied with an oscillator input signal for generating a phase controlled signal in response to said oscillator input signal;
   a frequency divider connected to said voltage controlled oscillator for producing a frequency divided signal having a signal phase;
   a phase comparator connected to said signal generator and said frequency divider for comparing said signal phase with said reference phase to produce a comparison result signal representative of a phase error between said reference phase and said signal phase;
   a first loop filter responsive to a filter input signal and connected to said voltage controlled oscillator for filtering said first filter input signal into said oscillator input signal, said first loop filter comprising a filter capacitor which is selectively charged and discharged in response to said first filter input signal;
   a first filter control circuit between said phase comparator and said first loop filter for supplying a first filter control signal as said first filter input signal to said first loop filter in response to said comparison result signal;
   a logical processing circuit connected to said phase comparator for processing said comparison result signal when said logical processing circuit is supplied with said switch control signal, said switch control signal being activated at said beginning of said phase lock operation and being deactivated at said end of said phase lock operation, said logical processing circuit producing a logical processed signal;

a second loop filter responsive to a second filter input signal for filtering said second filter input signal into a second filtered signal;

a second filter control circuit between said logical processing circuit and said second loop filter for supplying a second filter control signal as said second filter input signal to said second loop filter in response to said logical processed signal; and a switching circuit connected between said second loop filter and said first loop filter to supply said second filtered signal to said filter capacitor when said second circuit is activated with said switch control circuit.

* * * * *